United States Patent
Xu et al.

(10) Patent No.: US 8,430,153 B2
(45) Date of Patent: Apr. 30, 2013

(54) HEAT DISSIPATION DEVICE HAVING HEAT SINK ENCLOSING CONDUCTIVE MEMBER THEREIN

(75) Inventors: Shou-Biao Xu, Shenzhen (CN); Guo Chen, Shenzhen (CN); Shi-Wen Zhou, Shenzhen (CN); Chun-Chi Chen, Taipei Hsien (TW)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 737 days.

(21) Appl. No.: 12/643,931

(22) Filed: Dec. 21, 2009

(65) Prior Publication Data

US 2011/0083830 A1    Apr. 14, 2011

(30) Foreign Application Priority Data

Oct. 12, 2009    (CN) .......................... 2009 1 0308209

(51) Int. Cl.
*F28F 7/00*    (2006.01)
*F28D 15/00*    (2006.01)
(52) U.S. Cl.
USPC .................... 165/80.2; 165/80.3; 165/104.33; 165/121; 165/185

(58) Field of Classification Search ........ 165/80.1–80.3, 165/104.33, 121, 185; 361/697
See application file for complete search history.

(56) References Cited

U.S. PATENT DOCUMENTS

| | | | |
|---|---|---|---|
| 6,401,806 B1 * | 6/2002 | Lee et al. ..................... | 165/80.3 |
| 6,945,319 B1 * | 9/2005 | Li et al. ..................... | 165/104.33 |
| 7,100,681 B1 * | 9/2006 | Wu et al. ................... | 165/104.33 |
| D561,711 S * | 2/2008 | Lin ............................. | D13/179 |
| D573,109 S * | 7/2008 | Mochizuki et al. .......... | D13/179 |
| 7,548,426 B2 * | 6/2009 | Liu ............................... | 361/700 |
| D604,704 S * | 11/2009 | Jung et al. ..................... | D13/179 |
| 2006/0082972 A1 * | 4/2006 | Kim ............................. | 361/709 |
| 2008/0115914 A1 * | 5/2008 | Yang et al. ............... | 165/104.33 |
| 2008/0210404 A1 * | 9/2008 | Peng ........................... | 165/80.3 |
| 2009/0242176 A1 * | 10/2009 | Liu et al. ................... | 165/104.33 |
| 2010/0155023 A1 * | 6/2010 | Zhou et al. ................... | 165/80.3 |

* cited by examiner

*Primary Examiner* — Mohammad M Ali
*Assistant Examiner* — Ian Soule
(74) *Attorney, Agent, or Firm* — Altis Law Group, Inc.

(57) ABSTRACT

A heat dissipation device includes a base, a first heat sink mounted over the base and connected to the base via two first heat pipes, and a second heat sink located at a lateral side of the first heat sink and thermally connected to the base via a second heat pipe. The first heat sink includes two fin groups. One of the fin groups is stacked on the other fin group. Each of the fin groups includes a plurality of fins spreading radially from a center of the fin group to a periphery of the fin group along horizontal directions.

15 Claims, 3 Drawing Sheets

HEAT DISSIPATION DEVICE HAVING HEAT SINK ENCLOSING CONDUCTIVE MEMBER THEREIN

CROSS-REFERENCE TO RELATED APPLICATION

This application is related to a copending U.S. patent application Ser. No. 12/641,340, entitled "HEAT DISSIPATION DEVICE", filed simultaneously with this application, and having the same assignee as this application. The entire contents of the copending application are incorporated herein by reference.

BACKGROUND

1. Technical Field

The disclosure relates to heat dissipation devices and, more particularly, to a heat dissipation device for dissipating heat generated by an electronic component.

2. Description of Related Art

With the increasing development of computer technology, electronic components such as central processing units (CPUs) of computers are being made to work at higher operational speeds and to have greater functional capabilities. When an electronic component operates at high speed, it frequently generates large amounts of heat. The heat must be quickly removed from the electronic component to prevent it from becoming unstable or being damaged. Typically, a heat dissipation device is attached to an outer surface of the electronic component to absorb heat from the electronic component. The heat absorbed by the heat dissipation device is then dissipated to ambient air.

The heat dissipation device typically includes a heat sink made of aluminum, and a fan mounted on a top of the heat sink. The heat sink includes a solid core and a plurality of fins integrally projecting outwardly from the core. Due to the characteristics of the aluminum extrusion process, it is difficult to obtain compact fins or thin fins. Thus the heat dissipating efficiency of the heat dissipation device is limited. In this situation, in order to improve the heat dissipating capability, the volume of the heat sink is increased, thereby increasing the heat dissipating surface area of the heat dissipation device.

However, most electronic components are following the trend toward miniaturization. When a small electronic component is installed in a device such as a computer, usually only a little heat-dissipation space adjacent to the electronic component is available. Thus the above-described higher-volume heat dissipation device is not suitable for miniaturized applications. How to improve the heat dissipating efficiency of a heat dissipation device used in a small heat-dissipation space is an ongoing challenge in the art.

What is needed, therefore, is a heat dissipation device which is usable in a limited heat-dissipation space and which has good heat dissipating efficiency.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
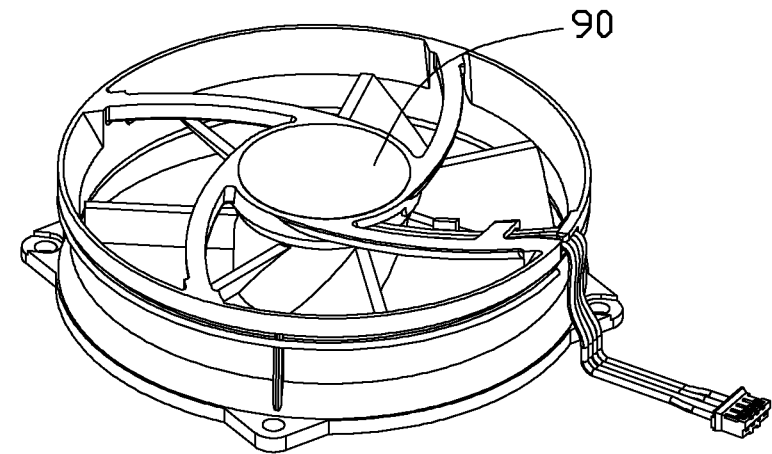
FIG. 1 is essentially an isometric, partially exploded view of a heat dissipation device in accordance with one embodiment of the disclosure.
Figure 1:
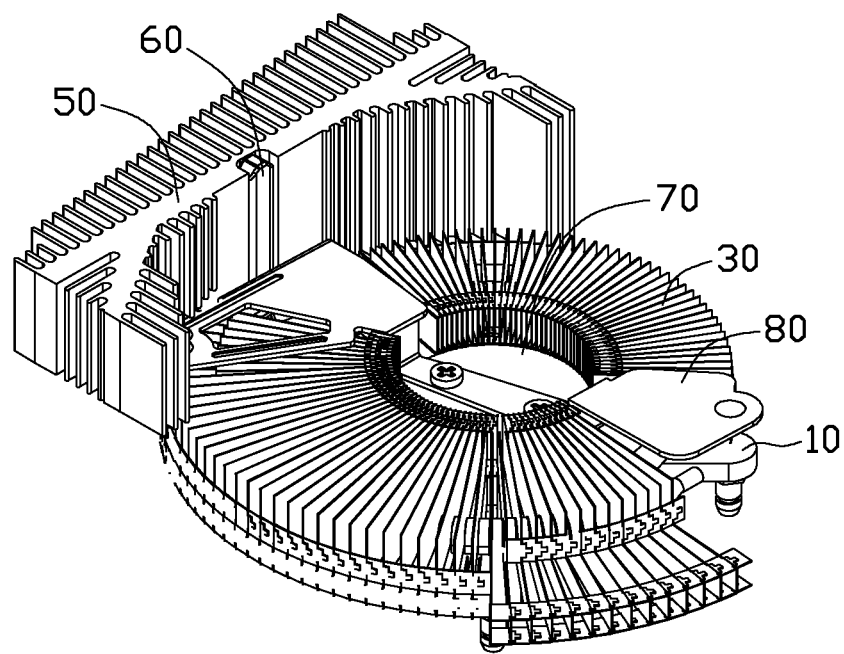

Referring to FIG. 1, a heat dissipation device in accordance with one embodiment of the disclosure is illustrated. The heat dissipation device is used to dissipate heat generated by an electronic component (not shown), such as a central processing unit (CPU) of a computer. The heat dissipation device includes a base 10, a first heat sink 30 mounted on the base 10, a second heat sink 50 located at a lateral side of the first heat sink 30, and a fan 90 mounted on a top of the first heat sink 30 via a fan holder 80.

Figure 2:
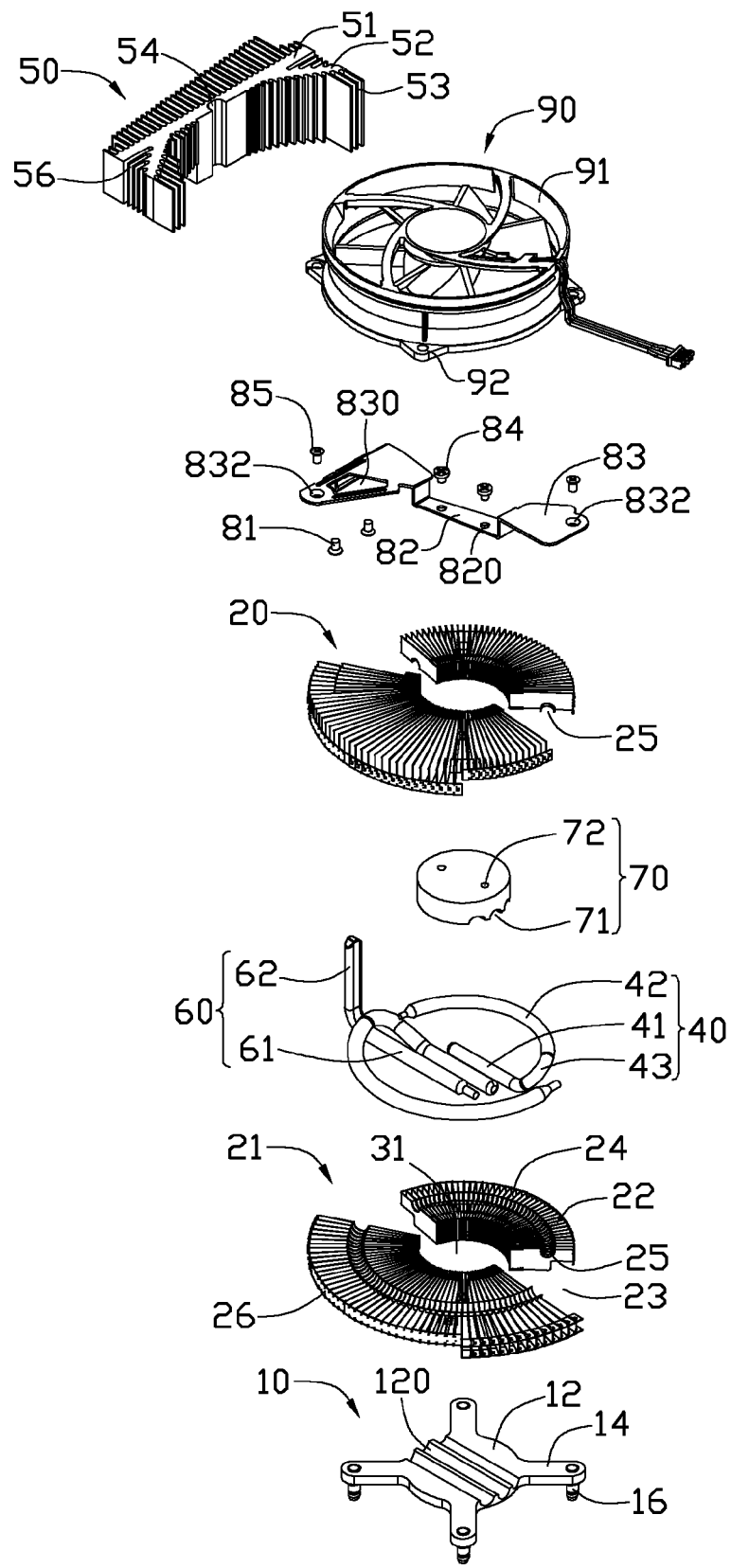
FIG. 2 is a fully exploded view of the heat dissipation device of FIG. 1.

Referring to FIG. 2 also, the base 10 is made of copper or aluminum or other suitable heat-conducting material. The base 10 has a bottom mating surface for contacting the electronic component. The base 10 includes a circular substrate 12, and four ears 14 extending outwards radially from a circumferential edge of the substrate 12. The ears 14 are equally angularly spaced from each other. The substrate 12 defines three parallel grooves 120 in a top surface thereof, the grooves 120 arranged side by side. Four mounting members 16 are mounted on the ears 14, for attaching the base 10 on the electronic component.

The first heat sink 30 includes a bottom fin group 21, a top fin group 20 mounted on a top of the bottom fin group 21, and two first heat pipes 40 thermally connecting the top and bottom fin groups 20, 21 and the base 10. The top and bottom fin groups 20, 21 each have a substantially disc-shaped (or annular) configuration. A height of the bottom fin group 21 is different from that of the top fin group 20. In this embodiment, the bottom fin group 21 has a height larger than that of the top fin group 20.

Each of the top and bottom fin groups 20, 21 includes fins 24 radially spreading from a center (not labeled) thereof to a periphery thereof along horizontal directions. In particular, each of the top and bottom fin groups 20, 21 includes two truncated sector-like fin units 22, 26 each having a plurality of spaced fins 24. An outmost end of each fin 24 has a perpendicular protrusion. In each of the fin units 22, 26, the protrusion of each fin 24 latches with an adjacent fin 24, and an inmost end of each fin 24 abuts the inmost end of the adjacent fin 24. Thereby, the fins 24 in each of the fin units 22, 26, are latched together. The fin units 22 of the top and bottom fin groups 20, 21 correspond to each other, and the fin units 26 of the top and bottom fin groups 20, 21 correspond to each other. The fin unit 22 of each of the top and bottom fin groups 20, 21 defines a vertex angle smaller than that of the corresponding fin unit 26. That is, an angle subtended by the fin unit 22 of each of the top and bottom fin groups 20, 21 is less than an angle subtended by the corresponding fin unit 26. The vertex angle (or subtended angle) is measured at the center of each of the top and bottom fin groups 20, 21.

In each of the top and bottom fin groups 20, 21, a radial length of each of the fins 24 of the fin unit 22 is smaller than that of each of the fins 24 of the fin unit 26. Some adjacent fins 24 of the fin unit 26 of the bottom fin group 21 have radial lengths larger than those of the other fins 24 of the fin unit 26, thereby increasing the heat dissipation area of the fin unit 26. Some adjacent fins 24 of the fin unit 26 of the top fin group 20 have radial lengths smaller than those of the other fins 24 of the fin unit 26. The fins 24 with smaller radial length of the fin unit 26 of the top fin group 20 correspond to the fins 24 with larger radial length of the fin unit 26 of the bottom fin group 21. In other embodiments, the configurations of the fins 24 of the top and bottom fin groups 20, 21 can be changed according to corresponding heat-dissipation spaces associated with various different electronic components.

Two cutouts 23 are defined in two opposite circumferential parts of the combination of the two fin groups 20, 21. A receiving hole 31 is defined in a central part of the combination of the two fin groups 20, 21, and is located between the two cutouts 23. The two cutouts 23 are truncated sectors in shape, and expand radially and outwardly from a center (not labeled) of the combination of the two fin groups 20, 21. The receiving hole 31 is circular and communicates with the two cutouts 23.

In the top fin group 20, an arc-shaped groove 25 is defined in a bottom of the fin unit 22, and an arc-shaped groove 25 is defined in a bottom of the fin unit 26. In the bottom fin group 21, an arc-shaped groove 25 is defined in a top of the fin unit 22, and an arc-shaped groove 25 is defined in a top of the fin unit 26. The two grooves 25 of the fin units 22 of the top and bottom fin groups 20, 21 face each other. The two grooves 25 of the fin units 26 of the top and bottom fin groups 20, 21 face each other. All the grooves 25 extend along an imaginary circle that is centered on a center (not labeled) of the first heat sink 30. The grooves 25 each define a semicircular cross section. The grooves 25 correspond to each other, whereby the grooves 25 cooperatively form two arc-shaped receiving grooves (not labeled) for receiving the first heat pipes 40 therein, respectively.

Each first heat pipe 40 is bent to have an evaporation section 41, a condensation section 42, and an adiabatic section 43 interconnecting the evaporation section 41 and the condensation section 42. The two evaporation sections 41 of the first heat pipes 40 are parallel to and adjacent to each other. The two evaporation sections 41 are received in two adjacent grooves 120 of the base 10. The two adiabatic sections 43 extend obliquely and upwardly from two corresponding opposite ends of the two evaporation sections 41. Each of the condensation sections 42 is bent into a substantially semicircular configuration, and extends from an upper end of a corresponding adiabatic section 43 along a horizontal direction. The condensation sections 42 cooperatively form a substantially circular configuration, and are received in the receiving grooves of the first heat sink 30.

A second heat pipe 60 is provided to thermally connect the base 10 and the second heat sink 50. The second heat pipe 60 includes an evaporation section 61, and a condensation section 62 extending vertically from an end of the evaporation section 61. The evaporation section 61 is parallel to the evaporation sections 41 of the first heat pipes 40, and is received in a corresponding groove 120 of the base 10. The evaporation section 61 extends horizontally beyond the circular configuration formed by the condensation sections 42 of the first heat pipes 40.

Figure 3:
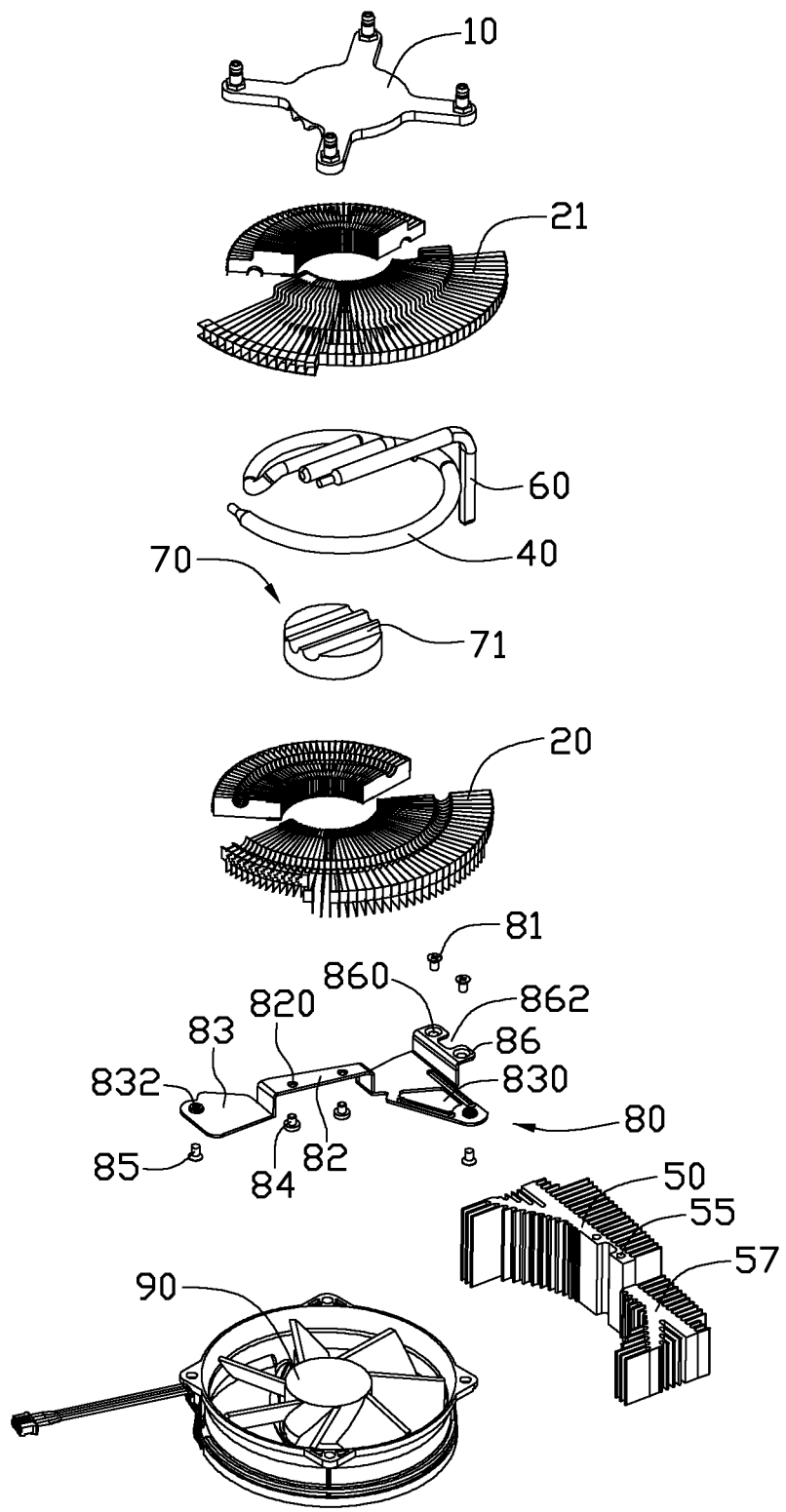
FIG. 3 is an inverted view of FIG. 2.

Also referring to FIG. 3, a heat conductive member 70 is generally in the form of a disk or cylinder. The heat conductive member 70 fits in the receiving hole 31 at the bottom fin group 21 of the first heat sink 30. The heat conductive member 70 is made of material, such as copper, having good heat conductivity. Three parallel troughs 71 are defined in a bottom surface of the heat conductive member 70. The troughs 71 and the grooves 120 of the base 10 cooperatively receive the evaporation sections 41, 61 of the first and second heat pipes 40, 60. The heat conductive member 70 is received in the receiving hole 31 of the first heat sink 30, and the bottom surface of the heat conductive member 70 abuts against the top surface of the substrate 12 of the base 10. A top surface of the heat conductive member 70 is substantially coplanar with a top surface defined by the bottom fin group 21 (see FIG. 1). Two mounting holes 72 are defined in the top surface of the heat conductive member 70. Two screws 84 extend through the fan holder 80 and are engaged in the mounting holes 72, so that the fan holder 80 is fixed in position at the top of the first heat sink 30.

The second heat sink 50 may be formed by aluminum extrusion, and has a generally C-shaped configuration. The second heat sink 50 includes a plate-shaped heat conductive body 51, two plate-shaped extension arms 52 extending aslant from two opposite end portions of the heat conductive body 51 in symmetrically opposite directions, and a plurality of spaced fins 53 extending outwardly from the heat conductive body 51 and the extension arms 52. In the illustrated embodiment, each two adjacent fins 53 are parallel to each other. An air passage 56 is defined between each two adjacent fins 53. The air passages 56 extend from tops of the fins 53 to bottoms of the fins 53. The fins 53 located at an inner side of the second heat sink 50 have extension lengths in a horizontal direction which gradually decrease from each of two opposite ends of the heat conductive body 51 to a center of the heat conductive body 51, thereby giving the inner side of the second heat sink 50 a generally C-shaped configuration. The heat conductive body 51 defines a vertical U-shaped slot 54 in the center of the inner side thereof, for receiving the condensation section 62 of the second heat pipe 60. A bottom of the second heat sink 50 defines two threaded blind holes 55 at two opposite sides of the slot 54, respectively. A cutout 57 is defined in the bottom of the second heat sink 50 at one side of the slot 54 but spaced from the slot 54. The cutout 57 is for preventing the second heat sink 50 from interfering with other members of the heat dissipation device. The inner side of the second heat sink 50 and a top surface of the first heat sink 30 cooperatively form a receiving space for receiving the fan 90 therein.

The fan holder 80 includes a securing portion 82, and two mounting portions 83 extending horizontally from two opposite ends of the securing portion 82, respectively. The securing portion 82 defines two extending holes 820. The screws 84 extend through the extending holes 820 and are engaged in the mounting holes 72, so that the securing portion 82 is secured to the top surface of the heat conductive member 70. Each of the mounting portions 83 is generally triangular. One of the mounting portions 83 covers one of the cutouts 23 of the first heat sink 30. The other mounting portion 83 has a part covering the other cutout 23 of the first heat sink 30, and another part extending beyond the other cutout 23 and located over the top fin group 20 of the first heat sink 30. The other part of the other mounting portion 83 defines a ventilating hole 830, thereby allowing airflow therethrough. The mounting portions 83 each define an engaging hole 832 in a free end thereof. A horizontal engaging portion 86 extends down from the other mounting portion 83. The engaging portion 86 defines two extending holes 860 at two opposite ends thereof. Two bolts 81 extend upwardly through the extending holes 860 and are engaged in the threaded blind holes 55 of the second heat sink 50, so that the engaging portion 86 supports the second heat sink 50. A cutout 862 is defined in the engaging portion 86 between the extending holes 860, for extension of the condensation section 62 of the second heat pipe 60 therethrough.

The fan 90 covers a top surface of the top fin group 20 of the first heat sink 30. The fan 90 includes an annular frame 91, and four triangular protrusions 92 extending outwardly from a periphery of the frame 91. Two bolts 85 extend through two of the protrusions 92, and are engaged in the engaging holes 832 of the fan holder 80, whereby the fan 90 is mounted on the fan holder 80. The inner side of the second heat sink 50 abuts a periphery of the frame 91. A top surface of the second heat sink 50 is substantially coplanar with a top surface of the fan 90.

In use of the heat dissipation device, the heat generated by the electronic component is transferred to the substrate 12 of the base 10 and the heat conductive member 70. The heat absorbed by the substrate 12 and the heat conductive member 70 is absorbed by the first and second heat pipes 40, 60, and then transferred to the first and second heat sinks 30, 50. Strong airflow can be generated by the fan 90, and the airflow carries away the heat absorbed by the first and second heat sinks 30, 50.

In the heat dissipation device, the fins 24 are latched together to form the top and bottom fin groups 20, 21. With the above-described configurations, compact and thin fins 24 can be achieved. Thereby, the heat dissipating area of the heat dissipation device is increased, and the heat dissipating efficiency of the heat dissipation device is improved. The compact and thin fins 24 enable the volume of the first heat sink 30 to be reduced. Therefore, the first heat sink 30 is suitable for miniaturized applications. In addition, the heat dissipation device has the second heat sink 50 at the side of the first heat sink 30, with the first and second heat sinks 30, 50 interconnected by the second heat pipe 60. The inner side of the second heat sink 50 abuts the periphery of the frame 91 of the fan 90, thereby making the most of a heat dissipating space that is available around the electronic component while still providing improved heat dissipating efficiency for the heat dissipation device.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device comprising:
    a base;
    a first heat sink mounted over the base, the first heat sink comprising two fin groups, one of the fin groups stacked on the other fin group, each of the fin groups comprising a plurality of fins spreading radially from a center of the fin group to a periphery of the fin group along horizontal directions, a central receiving hole defined in the first heat sink, the central receiving hole being an annular through hole with an open top end and an open bottom end, the bottom end of the central receiving hole closed by the base;
    two first heat pipes each connecting the base and the fin groups; said two first heat pipes further connecting said first heat sink to a second heat sink, said second heat sink being located at a lateral side of the first heat sink; a second heat pipe connecting the base and the second heat sink; and a heat conductive member, the heat conductive member inserted in the central receiving hole and mounted on the base.

2. The heat dissipation device of claim 1, wherein first ends of the first heat pipes are sandwiched between the fin groups, and opposite second ends of the first heat pipes are sandwiched between the base and the heat conductive member and thermally connected with the base and the heat conductive member.

3. The heat dissipation device of claim 2, further comprising a fan, wherein an inner side of the second heat sink and a top surface of the first heat sink cooperatively form a receiving space, and the fan is received in the receiving space.

4. The heat dissipation device of claim 3, wherein the inner side of the second heat sink has a generally C-shaped configuration, and abuts a periphery of the fan.

5. The heat dissipation device of claim 3, wherein each of the first heat pipes comprises an evaporation section thermally connected with the base and the heat conductive member, and a condensation section, the condensation section being bent into a generally semicircular configuration and being sandwiched between the fin groups.

6. The heat dissipation device of claim 1, wherein the second heat pipe comprises an evaporation section and a condensation section extending vertically from an end of the evaporation section, the evaporation section of the second heat pipe being sandwiched between the base and the heat conductive member, the condensation section of the second heat pipe being thermally connected with the second heat sink.

7. The heat dissipation device of claim 6, wherein the second heat sink comprises a heat conductive body, two extension arms extending aslant from two opposite end portions of the heat conductive body in symmetrically opposite directions, and a plurality of spaced fins extending outwardly from the heat conductive body and the extension arms.

8. The heat dissipation device of claim 7, wherein an air passage is defined between each two adjacent fins of the second heat sink, the air passage extending along a vertical direction.

9. The heat dissipation device of claim 3, further comprising a fan holder, wherein a middle portion of the fan holder is secured to a top of the heat conductive member, and the fan is mounted on the fan holder.

10. The heat dissipation device of claim 9, wherein the fan holder comprises a securing portion secured to the top of the heat conductive member, and two mounting portions extending outwardly and horizontally from two opposite ends of the securing portion, the fan being mounted on the mounting portions.

11. The heat dissipation device of claim 10, wherein an engaging portion extends down from one of the mounting portions and supports the second heat sink.

12. The heat dissipation device of claim 10, wherein the first heat sink defines two cutouts in two opposite circumferential parts thereof, and the mounting portions of the fan holder cover the cutouts, respectively.

13. A heat dissipation device comprising:
    a base;
    a first heat sink mounted over the base, the first heat sink comprising two fin groups, one of the fin groups stacked on the other fin group, each of the fin groups comprising a plurality of fins radially extending from a center of the fin group, a central receiving hole defined in the first heat sink, the central receiving hole being an annular through hole with an open top end and an open bottom end, the bottom end of the central receiving hole closed by the base;
    two first heat pipes each connecting the base and the fin groups; said two first heat pipes further connecting said first heat sink to a second heat sink, said second heat sink being located at a lateral side of the first heat sink; a second heat pipe connecting the base and the second heat sink;

a fan mounted on the first heat sink; and a heat conductive member, the heat conductive member inserted in the central receiving hole and mounted on the base;

wherein an inner side of the second heat sink and a top surface of the first heat sink cooperatively form a receiving space, and the fan is received in the receiving space.

14. The heat dissipation device of claim 13, further comprising a fan holder, wherein the fan holder has a middle portion secured to a top of the heat conductive member, and the fan is mounted on the fan holder.

15. The heat dissipation device of claim 14, further comprising two first heat pipes and a second heat pipe, each first heat pipe thermally connecting the base and the fin groups, with an end of each first heat pipe sandwiched between the base and the heat conductive member, and the second heat pipe thermally connecting the base and the second heat sink, with an end of the second heat pipe sandwiched between the base and the heat conductive member.

\* \* \* \* \*